(12) United States Patent
Ljungberg

(10) Patent No.: US 7,306,636 B2
(45) Date of Patent: Dec. 11, 2007

(54) OXIDE COATED CUTTING TOOL

(75) Inventor: Bjorn Ljungberg, Enskede (SE)

(73) Assignee: Sandvik Intellectual Property AB, Sandviken (SE)

( * ) Notice: Subject to any disclaimer, the term of this patent is extended or adjusted under 35 U.S.C. 154(b) by 114 days.

(21) Appl. No.: 10/807,376

(22) Filed: Mar. 24, 2004

(65) Prior Publication Data

US 2004/0253446 A1    Dec. 16, 2004

(51) Int. Cl.
*C23C 16/40* (2006.01)
(52) U.S. Cl. .................... 51/307; 407/119; 51/309; 428/325; 428/216; 428/336; 428/698; 428/701
(58) Field of Classification Search ............... 51/307, 51/309; 428/336, 325, 698, 701, 216; 407/119
See application file for complete search history.

(56) References Cited

U.S. PATENT DOCUMENTS

| | | | |
|---|---|---|---|
| 5,487,625 A | 1/1996 | Ljungberg et al. | |
| 5,516,588 A | 5/1996 | van den Berg et al. | |
| 5,587,233 A * | 12/1996 | Konig et al. ............... | 428/325 |
| 5,674,564 A | 10/1997 | Ljungberg et al. | |
| 5,698,314 A | 12/1997 | Goedicke et al. | |
| 5,766,782 A | 6/1998 | Ljungberg | |
| 5,863,640 A | 1/1999 | Ljungberg et al. | |
| 6,139,921 A | 10/2000 | Taschner et al. | |
| 6,565,957 B2 | 5/2003 | Nakamura et al. | |

FOREIGN PATENT DOCUMENTS

| | | |
|---|---|---|
| EP | 0523021 | 1/1993 |
| EP | 1 122 334 A1 | 8/2001 |
| GB | 1408193 | 10/1975 |
| SE | 514 177 | 1/2001 |

OTHER PUBLICATIONS

Ch. Täschner et al., "Deposition of hard crystalline $Al_2O_3$ coatings by pulsed d.c. PACVD", Surface and Coatings Technology 116-119, 1999 Elsevier Science S.A., pp. 891-897.
O. Zywitzki et al., "Correlation between structure and properties of reactively deposited $Al_2O$-coatings by pulsed magnetron sputtering", Surface and Coatings Technology 94-95, 1997 Elsevier Science S.A., pp. 303-308.

* cited by examiner

*Primary Examiner*—Archene Turner
(74) *Attorney, Agent, or Firm*—Drinker Biddle & Reath LLP

(57) ABSTRACT

The present invention relates to a method of depositing a crystalline $\alpha$-$Al_2O_3$-layer onto a cutting tool insert by Chemical Vapor Deposition at a temperature of from about 625 to about 800° C. The method comprises the following steps:

depositing a from about 0.1 to about 1.5 μm layer of $TiC_xN_yO_z$ where $x+y+z>=1$ and $z>0$, preferably $z>0.2$;

treating said layer at 625-1000° C. in a gas mixture containing from about 0.5 to about 3 vol-% $O_2$, preferably as $CO_2+H_2$ or $O_2+H_2$, for a short period of time from about 0.5 to about 4 min, optionally in the presence of from about 0.5 to about 6 vol-% HCl; and depositing said $Al_2O_3$-layer by bringing said treated layer into contact with a gas mixture containing from about 2 to about 10 vol-% of $AlCl_3$, from about 16 to about 40 vol-% of $CO_2$, in $H_2$ and 0.8-2 vol-% of a sulphur-containing agent, preferably $H_2S$, at a process pressure of from about 40 to about 300 mbar. The invention also includes a cutting tool insert with a coating including at least one $\alpha$-$Al_2O_3$-layer according to the invention.

17 Claims, 2 Drawing Sheets

OXIDE COATED CUTTING TOOL

BACKGROUND OF THE INVENTION

The present invention relates to a CVD coating process for depositing $\alpha$-$Al_2O_3$ layers at low temperatures as well as to a coated cutting tool for chip forming machining. The coated cutting tool includes at least one $Al_2O_3$-layer deposited according to the present process. The coated tool shows improved toughness behavior when used in interrupted cutting operations and improved wear resistance if the $Al_2O_3$ layer is deposited onto a PVD-precoated tool.

Cemented carbide cutting tools coated with various types of hard layers like TiC, TiCN, TiN and $Al_2O_3$ have been commercially available for years. Such tool coatings are generally built up by several hard layers in a multilayer structure. The sequence and the thickness of the individual layers are carefully chosen to suit different cutting applications and work-piece materials, e.g. cast iron and stainless steel.

Tool coatings are most frequently deposited by Chemical Vapor Deposition (CVD) or Physical Vapor Deposition (PVD) techniques. In some rare cases also Plasma Assisted Chemical Vapor Deposition (PACVD) has been used. The CVD technique employed for coating cemented carbide tools is conducted at a rather high temperature, from about 880 to about 1000° C. Due to this high deposition temperature and to a mismatch in thermal expansion coefficient between the deposited coating materials and the cemented carbide tool, CVD produces coatings with cooling cracks and tensile stresses. The PVD technique runs at a significantly lower temperature from about 450 to about 700° C. and it is performed under ion bombardment leading to high compressive stresses in the coating and no cooling cracks. Because of these process differences, CVD-coated tools are more brittle and thereby possess inferior toughness behavior compared to PVD coated tools.

With the CVD-technique it is possible to deposit many hard and wear resistant coating materials like $Al_2O_3$, TiC, Ti(C,N), TiN, $TiC_xN_yO_z$ and $ZrO_2$. The microstructure and thereby the properties of these coatings can be altered quite considerably by varying the deposition conditions. If the standard CVD deposition temperature could be decreased significantly, an increased toughness of the coated tool would be expected.

A noticeable improvement in performance of CVD-coated tools came about when the MTCVD (Moderate Temperature CVD)-technique began to come into the tool industry from about 5 to about 10 years ago. An improvement in the toughness behavior of the tool was obtained. Today the majority of tool producers use this technique. Unfortunately the MTCVD-technique is limited only to fabrication of Ti(C,N)-layers. The deposition process here takes place at temperatures in the range from about 700 to about 900° C. It uses a gas mixture of $CH_3CN$, $TiCl_4$ and $H_2$.

It is generally accepted that modern tool coatings also should include at least one layer of $Al_2O_3$ in order to achieve high crater wear resistance. Hence, it would be desirable if also high quality $Al_2O_3$ layers could be deposited by a CVD-process at a temperature in the range similar to that of the MTCVD TiCN-process and closer to the PVD-process temperatures if combined PVD-CVD coatings are desired.

It is well known that $Al_2O_3$ crystallises in several different phases: $\alpha$, $\kappa$, $\gamma$, $\delta$, $\theta$ etc. The most common CVD deposition temperature for $Al_2O_3$ is in the range from about 980 to about 1050° C. At these temperatures both singlephase $\kappa$-$Al_2O_3$ and singlephase $\alpha$-$Al_2O_3$ can be produced or mixtures thereof. Occasionally also the $\theta$-phase can be present in smaller amounts.

In U.S. Pat. No. 5,674,564 is disclosed a method of growing a fine-grained $\kappa$-alumina layer by employing a low deposition temperature and a high concentration of a sulphur compound.

In U.S. Pat. No. 5,487,625 a method is disclosed for obtaining a fine grained, (012)-textured $\alpha$-$Al_2O_3$ layer consisting of columnar grains with a small cross section (about 1 μm).

In U.S. Pat. No. 5,766,782 a method is disclosed for obtaining a fine-grained (104)-textured $\alpha$-$Al_2O_3$ layer.

Nanocrystalline $\alpha$-$Al_2O_3$ layers can be deposited by PVD- and PACVD technique at low temperatures as disclosed in U.S. Pat. Nos. 5,698,314, 6,139,921 and 5,516,588. However these techniques are much more technically complicated, process sensitive and have less throwing power than the CVD-technique when used for depositing $\alpha$-$Al_2O_3$ The $\kappa$-$Al_2O_3$-, $\gamma$-$Al_2O_3$- and $\alpha$-$Al_2O_3$-layers have slightly different wear properties when cutting different materials. Broadly speaking, the $\alpha$-phase is preferred when cutting cast iron while the $\kappa$-phase is more often used when cutting low carbon steels. It would also be desirable to be able to produce $\alpha$-$Al_2O_3$-layers at temperatures e g <700° C. that e g can be combined with MTCVD Ti(C,N)-layers or even can be deposited onto PVD-coated layers. Low temperature processes for $\kappa$-$Al_2O_3$ and $\gamma$-$Al_2O_3$ are disclosed in U.S. Pat. No. 5,674,564 and in EP-A-1122334. Deposition temperatures in the ranges of from about 800 to about 950° C. and from about 700 to about 900° C. are disclosed.

In DE-A-101 15 390 a coating is disclosed consisting of a PVD-coated inner layer with a top layer of $Al_2O_3$ deposited by the CVD-technique at a medium temperature. The $Al_2O_3$-layer can be essentially any of the modifications: $\kappa$, $\alpha$, $\delta$ and amorphous. A temperature range of from about 700 to about 850° C. is claimed for the deposition process. However, no method for depositing the $\alpha$-$Al_2O_3$ phase at temperatures less than 850° C. is disclosed.

Since $\alpha$-$Al_2O_3$ is the high temperature stable aluminium oxide phase, one would not expect it to be formed at temperatures <800° C. EP-A-1122334 and U.S. Pat. No. 5,674,564 point toward the reasonable assumption that only the metastable phases are possible to be obtained at these low temperatures. So far there have not been any reports on a CVD-process capable of depositing well-crystalline $\alpha$-$Al_2O_3$ at temperatures <800° C. that can be used as a tool coating. However, low temperature $Al_2O_3$ CVD-processes using Al-metallo-organic compounds have been reported. Such coatings are generally impure and possess no or low crystallinity and hence are not suitable as tool coatings.

The lifetime and the performance of a coated cutting tool are closely related to the method by which the coating is produced. As mentioned above, high temperature deposition processes generally give cutting tools with lower toughness behavior compared to coatings deposited at lower temperatures. This is due to many factors like differences in the number of cooling cracks formed in the coating, differences in the tensile stress state, influence of the process on the cemented carbide tool body e g degree of decarburisation and degree of diffusion of elements from the cemented carbide into the coating.

On the other hand high temperature deposition processes generally give better coating adhesion due to a substantial interdiffusion of materials from the tool body into the growing coating.

However, there are many cutting operations where high toughness of the tool is more important than high coating adhesion. In such cutting operations the tougher PVD coated tools are frequently used.

PVD-coated tools generally lack wear resistance in comparison to CVD-coated tools. If the temperature of the CVD-process could be lowered for all, or at least for the majority of the coating steps then a higher toughness would be expected and such a CVD-coated tool may better complement the pure PVD-tools in operations where both toughness and high wear resistance is required.

OBJECTS AND SUMMARY OF THE INVENTION

It is an object of the present invention to provide a CVD process for depositing an α-$Al_2O_3$ layer at a temperature below 800° C.

It is a further object of the invention to provide onto a hard tool body a wear resistant coating comprising at least one layer essentially consisting of α-$Al_2O_3$ deposited by CVD at a temperature (T) below 800° C. Other layers in the coating can be deposited by MTCVD or by PVD-technique and PACVD (plasma assisted CVD) at low temperatures.

It is still a further object of the invention to provide an alumina coated cutting tool insert, a solid carbide drill or carbide end-mill with improved cutting performance in steel.

In one aspect of the invention, there is provided a method of depositing a crystalline α-$Al_2O_3$-layer onto a cutting tool insert by chemical vapor deposition comprising the following steps: depositing a from about 0.1 to about 1.5 μm layer of $TiC_xN_yO_z$ where $x+y+z=1$ and $z>0$; treating said layer at from about 625 to about 1000° C. in a gas mixture containing from about 0.5 to about 3 vol-% $O_2$ for a short period of time from about 0.5 to about 4 min; and depositing said $Al_2O_3$-layer by bringing said treated layer into contact with a gas mixture containing from about 2 to about 10 vol-% of $AlCl_3$, from about 16 to about 40 vol-% of $CO_2$, in $H_2$ and from about 0.8 to about 2 vol-% of a sulphur-containing agent at a process pressure of from about 40 to about 300 mbar and a temperature of from about 625 to about 800° C.

In another aspect of the invention, there is provided a cutting tool comprising a body of sintered cemented carbide, cermet, ceramic, high speed steel or the superhard materials and with at least on the functioning parts of the surface of the body, a hard and wear resistant coating comprising at least one layer consisting essentially of crystalline α-$Al_2O_3$ with a thickness of from about 0.5 to about 10 μm, said crystalline α-$Al_2O_3$ having columnar grains with an average grain width of from about 0.1 to about 1.1 μm and being deposited by chemical vapor deposition at a temperature of from about 625 to about 800° C.

BRIEF DESCRIPTION OF THE DRAWINGS

FIG. 1 shows an α-$Al_2O_3$-layer deposited onto a PVD TiN precoated tool at 690° C.

FIG. 2 shows an α-$Al_2O_3$-layer deposited onto a CVD Ti(C,N) precoated tool with a Ti(C,O) intermediate layer at 690° C.

FIG. 3 shows an α-$Al_2O_3$-layer deposited onto a CVD Ti(C,N) precoated tool with a Ti(C,O) intermediate layer at 625° C.

DETAILED DESCRIPTION OF THE INVENTION

Figure 1:
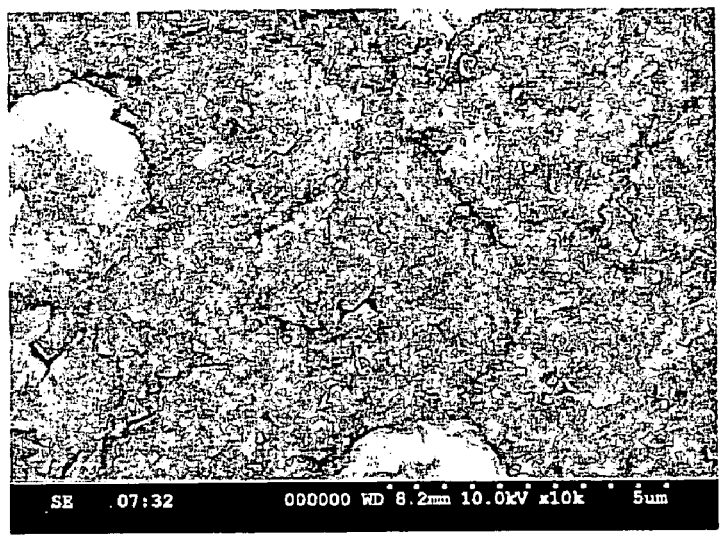
FIGS. 1-3 show Scanning Electron Microscope (SEM) micrographs in top view projections of an α-$Al_2O_3$ layer deposited according to the present invention in ×10000 magnification.

It was surprisingly found after carrying out a lot of deposition experiments that also well-crystalline layers of 100% α-$Al_2O_3$ in fact can be deposited at such low temperatures as down to 625° C. if the $Al_2O_3$ is deposited on preferably an oxygen rich layer that first is treated with an oxygen containing gas mixture and the subsequent $Al_2O_3$-process uses high concentration of $CO_2$ and a sulphur dopant, preferably $H_2S$. If the oxygen treatment step is excluded then mainly amorphous or metastable phases of $Al_2O_3$ are formed.

The present invention thus relates to a method of making a cutting tool for metal machining such as turning, milling and drilling comprising a coating and a substrate. The coating comprises at least one well-crystalline layer consisting of 100% α-$Al_2O_3$ deposited at from about 625 to about 800° C. using Chemical Vapor Deposition technique. The substrate consists of a hard alloy such as cemented carbide, cermet, ceramics or high speed steel or the superhard materials such as cubic boron nitride or diamond.

The $Al_2O_3$-layer according to the invention is generally deposited on a substrate that has been precoated with at least one wear resistant inner layer as known in the art. A from about 1 to about 1.5 μm intermediate layer of $TiC_xN_yO_z$ where $x+y+z=1$ and $z>0$, preferably $z>0.2$, is first deposited at from about 450 to about 600° C. using PVD-technique or at from about 1000 to about 1050° C. using CVD-technique. Prior to the start of the $Al_2O_3$-coating step, the $TiC_xN_yO_z$-layer is treated with a gas mixture containing from about 0.5 to about 3 vol-% $O_2$ preferably as $CO_2+H_2$ or $O_2+H_2$, optionally adding from about 0.5 to about 6 vol-% HCl for a short period of time from about 0.5 to about 4 min at temperatures between 625 and 1050° C., preferably around 1000° C., if the intermediate layer is deposited by CVD or around 625° C. if the inner layer is deposited by PVD. This step is conducted in order to increase the oxygen content in the surface zone of the intermediate layer. The subsequent $Al_2O_3$ deposition process is performed with the following concentrations in vol-%: from about 16 to about 40 $CO_2$, from about 0.8 to about 2 $H_2S$, from about 2 to about 10 $AlCl_3$, preferably from about 2 to about 7 vol-% HCl and balance $H_2$ at a process pressure of from about 40 to about 300 mbar and a temperature of from about 625 to about 800, preferably from about 625 to about 700, most preferably from about 650 to about 695° C.

In an alternative embodiment, the $TiC_xN_yO_z$ intermediate layer is excluded and the surface of the inner layer is scratched prior to the $Al_2O_3$ coating step(s) with hard particles, e.g., diamond in an ultra sonic bath or by a blasting treatment. This applies in particular to a PVD-precoated surface or when depositing at temperatures below 675° C.

The invention also relates to a cutting tool comprising a body of sintered cemented carbide, cermet or ceramic or high speed steel or the superhard materials such as cubic boron nitride or diamond with at least on the functioning parts of the surface of the body, a hard and wear resistant coating comprising at least one layer consisting essentially of crystalline α-$Al_2O_3$ with a thickness of from about 0.5 to about 10 μm, with columnar grains with an average grain width of from about 0.1 to about 1.1 μm and deposited at a temperature of from about 625 to about 800° C. Said coating comprises at least one layer consisting of Ti(C,N) with a thickness of from about 0.5 to about 10 μm deposited by the MTCVD technique at a temperature less than 885° C. and preferably with an intermediate layer of from about 0.5 to about 1.5 μm of $TiC_xN_yO_z$, preferably x=z=0.5 and y=0, between the α-$Al_2O_3$-layer and the MTCVD coated Ti(C, N)-layer. Alternatively, said coating comprises layer(s) adjacent to the tool body deposited by PVD or PACVD preferably with an intermediate layer of from about 0.1 to about 1.5 μm $TiC_xN_yO_z$, preferably with x<0.1, between the α-$Al_2O_3$ and the PVD- or PACVD-layer(s). In this case, the α-$Al_2O_3$-layer has a pronounced columnar grain structure with a grain width of <0.5 μm. Preferably one such α-$Al_2O_3$ layer is the top visible layer at least along the cutting edge line. The coating on the rake face and along the edge line is smoothed by brushing or by blasting to a surface roughness ($R_a$) of less than 0.2 μm over a measured length of 5 μm.

The tool coated according to the present invention can be a cutting insert or a solid carbide drill or carbide end-mill.

If the grain size of the $Al_2O_3$-layer is to be determined from a top view projection after the smoothing operation, then the $Al_2O_3$ layer is preferably first etched with a mixture of HF and $HNO_3$ or the grain size can be measured on a fractured sample in a Scanning Electron Microscope as the width of the grains.

The coatings deposited in the examples below were carried out in CVD- and PVD-tool coaters capable in housing several thousands of cutting tool inserts.

The invention is additionally illustrated in connection with the following Examples, which are to be considered as illustrative of the present invention. It should be understood, however, that the invention is not limited to the specific details of the Examples.

EXAMPLE 1

A) Cemented carbide cutting inserts in style CNMG 120408-PM with the composition 7.5 wt % Co, 1.8 wt % TiC, 0.5 wt % TiN, 3 wt % TaC, 0.4 wt % NbC and balance WC were coated with a 1 μm thick layer of TiN using conventional CVD-technique at 930° C. followed by a 5 μm TiCN layer employing the MTCVD-technique using $TiCl_4$, $H_2$, $N_2$ and $CH_3CN$ as process gases at a temperature of 700° C. In subsequent process steps during the same coating cycle, a layer of Ti(C,O) about 0.5 μm thick was deposited at 1000° C., and then the reactor was flushed with a mixture of 2% $CO_2$, 5% HCl and 93% $H_2$ for 2 min before cooling down in an argon atmosphere to 690° C. at which a 2 μm thick layer of α-$Al_2O_3$ was deposited according to the present coating process conditions. The process conditions during the deposition steps were as below:

| Step | TiN | Ti(C,N) | Ti(C,O) | Flush | $Al_2O_3$ |
|---|---|---|---|---|---|
| $TiCl_4$ | 1.5% | 1.4% | 2% | | |
| $N_2$ | 38% | 38% | | | |
| $CO_2$: | | | | 2% | 20% |
| CO | | | 6% | | |
| $AlCl_3$: | | | | | 3.2% |
| $H_2S$ | — | | | | 1% |
| HCl | | | | 5% | 3.2% |
| $H_2$: | balance | balance | balance | balance | balance |
| $CH_3CN$ | — | 0.6% | | | |

-continued

| Step | TiN | Ti(C,N) | Ti(C,O) | Flush | $Al_2O_3$ |
|---|---|---|---|---|---|
| Pressure: | 160 mbar | 60 mbar | 60 mbar | 60 mbar | 70 mbar |
| Temperature: | 930° C. | 700° C. | 1000° C. | 1000° C. | 690° C. |
| Duration: | 30 min | 4 h | 20 min | 2 min | 5 h |

Figure 4:
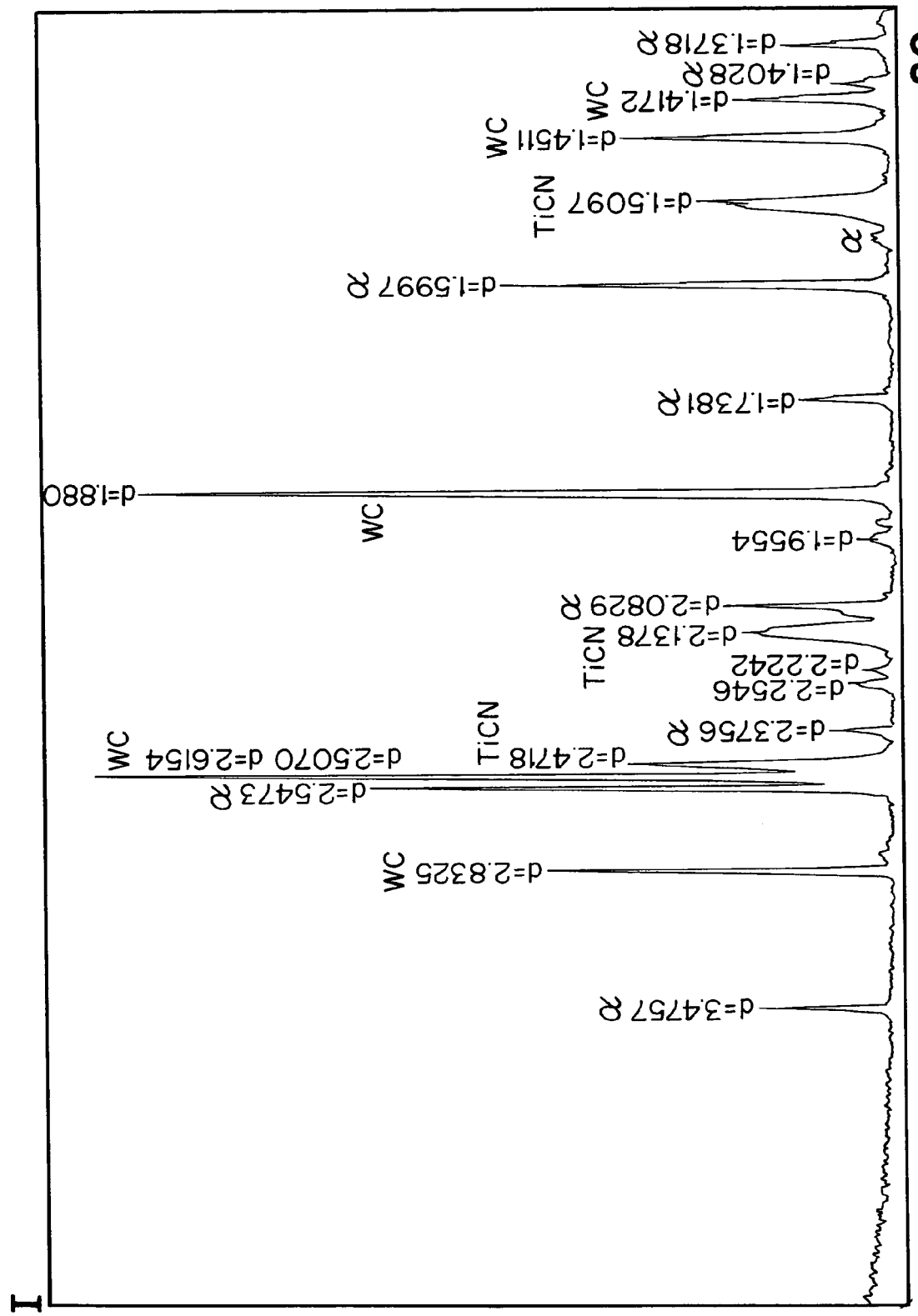
FIG. 4 shows an XRD-diffraction pattern of a coating comprising a layer deposited by the invented low temperature $Al_2O_3$-process.

XRD-analysis of the deposited $Al_2O_3$ layer showed that it consisted only of the α-phase, FIG. 4. No diffraction peaks from κ- or γ-phase were hence detected.

Figure 2:
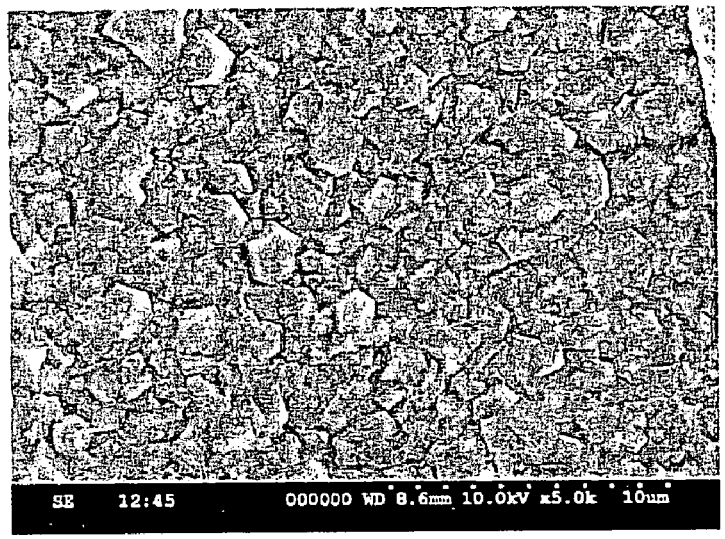
Figure 3:
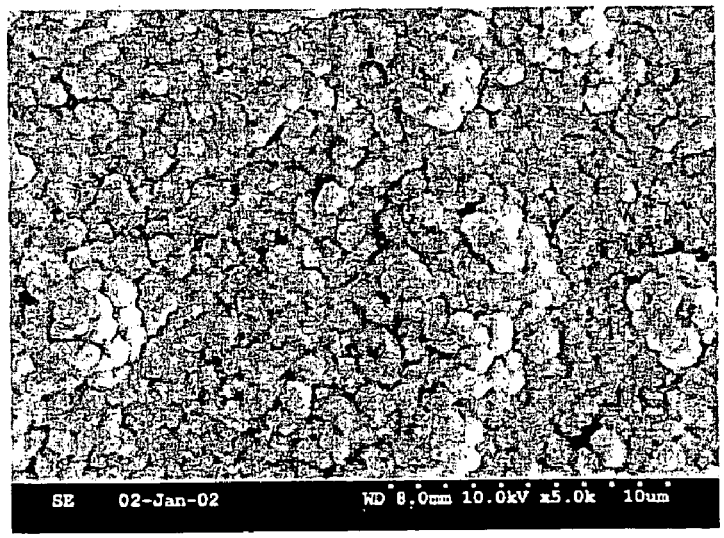

An SEM-micrograph in top-view projection is shown in FIG. 2.

The α-$Al_2O_3$ layer was astonishingly well crystalline to have been deposited at such low temperature as 690° C. A grain size of about 1 μm was observed.

B) Cemented carbide cutting inserts in style CNMG 120408-PM with the composition 7.5 wt % Co, 1.8 wt % TiC, 0.5 wt % TiN, 3 wt % TaC, 0.4 wt % NbC and balance WC were coated with a 1 μm thick layer of TiN using conventional CVD-technique at 930° C. followed by a 5 μm TiCN layer employing the MTCVD-technique using $TiCl_4$, $H_2$, $N_2$ and $CH_3CN$ as process gases at a temperature of 700° C. In subsequent process steps during the same coating cycle, a 0.5 μm Ti(C,O) was deposited at 1000° C. Then a 2 μm thick α-$Al_2O_3$-layer was deposited according to prior art technique similar to what is disclosed in U.S. Pat. No. 5,487,625 at 1010° C. The process conditions during the $Al_2O_3$ deposition were as below:

| Step | TiN | Ti(C,N) | Ti(C,O) | $Al_2O_3$ | $Al_2O_3$ |
|---|---|---|---|---|---|
| $TiCl_4$ | 1.5% | 1.4% | 2% | | |
| $N_2$ | 38% | 38% | | | |
| $CO_2$: | | | | 4% | 4% |
| CO | | | 6% | | |
| $AlCl_3$: | | | | 4% | 4% |
| $H_2S$ | — | | | | 0.2% |
| HCl | | | | 1% | 4% |
| $H_2$: | balance | balance | balance | balance | Balance |
| $CH_3CN$ | — | 0.6% | | | |
| Pressure: | 160 mbar | 60 mbar | 60 mbar | 65 mbar | 65 mbar |
| Temperature: | 930° C. | 700° C. | 1000° C. | 1010° C. | 1010° C. |
| Duration: | 30 min | 4 h | 20 min | 30 min | 110 min |

XRD-analysis of the deposited $Al_2O_3$ layer showed that it consisted only of the α-phase.

EXAMPLE 2

C) Inserts in style CNMG 120408-PM with the composition 7.5 wt % Co, 1.8 wt % TiC, 0.5 wt % TiN, 3 wt % TaC, 0.4 wt % NbC and balance WC were coated with 2 μm of TiN by PVD (ion plating technique).

D) Cemented carbide substrate of the same style and composition as in C were coated by PVD (ion plating technique) with 4 μm of TiN.

E) TiN-precoated inserts from C) were coated with 2 μm of $Al_2O_3$ according to the present process.

The coating was performed according to the process:

| Step | Flush | $Al_2O_3$ |
|---|---|---|
| $CO_2$: | 3.4% | 20% |
| $AlCl_3$: | | 3.2% |

-continued

| Step | Flush | Al$_2$O$_3$ |
|---|---|---|
| H$_2$S | | 1% |
| HCl | 1.5% | 3.2% |
| H$_2$: | balance | balance |
| Pressure: | 60 mbar | 70 mbar |
| Temperature: | 690° C. | 690° C. |
| Duration: | 3 min | 5 h |

XRD-analysis of the deposited Al$_2$O$_3$ layer showed that it consisted of the α-phase. No diffraction peaks from κ- or γ-phase could be detected. A SEM-micrograph in top-view projection of the obtained coating is shown in FIG. 1. An average grain size of about 0.25 μm was found.

F) TiN-precoated inserts from C) were coated with 2 μm of Al$_2$O$_3$ according to a prior art process similar to what is disclosed in U.S. Pat. No. 5,487,625.

The coated was performed according to the process:

| Step | Al$_2$O$_3$ | Al$_2$O$_3$ |
|---|---|---|
| CO$_2$: | 4% | 4% |
| AlCl$_3$ | 4% | 4% |
| H$_2$S | | 0.2% |
| HCl | 1% | 4%% |
| H$_2$: | balance | balance |
| Pressure: | 65 mbar | 65 mbar |
| Temperature: | 1010° C. | 1010° C. |
| Duration: | 30 min | 110 min |

XRD-analysis of the deposited Al$_2$O$_3$ layer showed that it consisted of the α-phase.

The inserts from A), B), E) and F) were brushed with a nylon brush containing SiC grains in order to smooth the coating surfaces. The PVD coated inserts from D) showed high smoothness already as coated and were therefore not subjected to brushing.

Coated insert from A) and B) were then tested with respect to toughness in a specially designed work-piece. The work-piece consisted of two flat steel plates of material SS1312 clamped together side to side with a distance bar in between leaving a gap between the plates. The plates were cut longitudinal with an increased feed rate until the cutting edge broke. The time to breakage was recorded for each tested insert. Within each variant population some edges last longer than others and the life time of each tested edge was recorded. The obtained result are below presented as time for the insert with shortest life time, time for the insert with the longest life time and time to when 50% of the edges within the population had obtained breakage. Ten inserts from A) and B) were run to edge breakage.

Cutting Operation 1:
Dry condition
V=100 m/min
A=1.5 mm
Feed=0.15-0.35 mm/rev
Feed rate increase 0.1 mm/min Result:

| | Time to first breakage, sec's | Time when 50% of the insert had failed, sec's | Time when last insert broke, sec's |
|---|---|---|---|
| B) Prior art | 24 | 66 | 83 |
| A) Invention | 62 | 80 | 105 |

Cutting Operation 2:

A facing operation in an alloyed steel (AISI 1518,W-no 1.0580) was performed. The shape of the work-piece was such that the cutting edge was out of cut three times per revolution.

Cutting Data:
Speed: 130-220 m/min
Feed: 0.2 mm/rev.
Depth of cut: 2.0 mm

Five inserts (edges) were run one cut over the work-piece. The results in table 2 are expressed as percentage of the edge-line in cut that obtained flaking of the coating.

TABLE 2

| | Cutting operation 2 |
|---|---|
| Variant | Edge line Flaking average |
| B) Prior art | <10% only small dots of flaking |
| A) Invention | <10% only small dots of flaking |

From the results from cutting tests 1 and 2 it can be concluded that the inserts according to present invention posses a higher toughness and equal flaking resistance compared to prior art inserts.

Cutting Operation 3:

Cutting inserts from D), E) and F) were tested in a longitudinal turning operation in a ball bearing steel Ovako 825B.

Cutting Data:
Cutting speed 210 m/min,
Feed 0.25 mm/rev,
Depth of cut 2.0 mm, coolant was used.

The cutting operation was periodically interrupted in order to follow closely the development of the crater wear. The wear was measured (observed) in a microscope. The machining time until the coating broke through and the carbide substrate became visible in the bottom of the crater wear.

| Variant | Time to carbide visible |
|---|---|
| D) PVD TiN precoated | less than 1 min |
| E) PVD-TiN + α-Al$_2$O$_3$ acc. to the invention | About 5 min |
| F) PVD-TiN + α-Al$_2$O$_3$ acc. to prior art | About 5 min |

Cutting Operation 4:

Cutting inserts from D), E) and F) were tested with respect of edge line flaking in a facing operation in an alloyed steel (AISI 1518, W-no. 1.0580). The shape of the work piece was such that the cutting edge was out of cut three times during each revolution.

Cutting Data:
Cutting speed 130-220 m/min,
Feed 0.2 mm/rev,
Depth of cut 2.0 mm.

The inserts were run one cut over the work-piece. The results are expressed as percentage of the edge line in cut that had obtained flaking.

| Variant | Percentage of edge line that obtained flaking |
|---|---|
| D) PVD-TiN | About 5% |
| E) PVD-TiN + α-Al$_2$O$_3$ acc. to invention | About 15% |
| F) PVD-TiN + α-Al$_2$O$_3$ acc. to prior art | About 75% + flaking spread onto the rake face |

From the results obtained in cutting operation 3 and 4 it can be concluded that the insert according to the invention has improved crater wear properties over PVD coated tool and better coating adhesion than variant F) with a prior art high temperature CVD Al$_2$O$_3$ on top of a PVD-TiN layer. Obviously the PVD TiN-pre-coating can not withstand the high temperature of the prior art Al$_2$O$_3$-process.

The principles, preferred embodiments, and modes of operation of the present invention have been described in the foregoing specification. The invention, which is intended to be protected herein, however, is not to be construed as limited to the particular forms disclosed, since these are to be regarded as illustrative rather than restrictive. Variations and changes may be made by those skilled in the art without departing from the spirit of the invention.

I claim:

1. Cutting tool comprising a body with, at least on functioning parts of a surface of the body, a hard and wear resistant coating comprising at least one layer consisting essentially of crystalline α-Al$_2$O$_3$ with a thickness of from about 0.5 to about 10 μm, said crystalline α-Al$_2$O$_3$ having columnar grains with an average grain width of from about 0.1 to about 1.1 μm and being deposited by chemical vapor deposition at a temperature of from about 625 to about 800° C.

2. The cutting tool of claim 1, wherein the body comprises sintered cemented carbide, cermet, ceramic, high speed steel or superhard materials.

3. The cutting tool of claim 2 wherein said body comprises a body of cubic boron nitride or diamond.

4. The cutting tool of claim 1 wherein said coating comprises at least one layer consisting of Ti(C,N) with a thickness of from about 0.5 to about 10 μm deposited between the body and said α-Al$_2$O$_3$-layer by the MTCVD technique at a temperature less than 885° C.

5. The cutting tool according to claim 4 wherein said coating further comprises an intermediate layer of from about 0.5 to about 1.5 μm of TiC$_x$N$_y$O$_z$ where x+y+z>=1 and z>0 between the α-Al$_2$O$_3$-layer and the MTCVD-TiCN-layer.

6. The cutting tool according to claim 5 wherein in said intermediate layer z>0.2.

7. The cutting tool according to claim 6 wherein in said coating intermediate layer z>0.2, y=0 and x>=0.

8. The cutting tool of claim 1 wherein said coating comprises at least one layer adjacent to the tool body deposited by PVD or PACVD.

9. The cutting tool of claim 8 wherein said coating comprises an intermediate layer of from about 0.1 to about 1.5 μm TiC$_x$N$_y$O$_z$ between the α-Al$_2$O$_3$ and the PVD or PACVD-layer(s,) where x+y+z>1 and z>0.

10. The cutting tool of claim 9 wherein in said intermediate layer z>0.2.

11. The cutting tool of claim 10 wherein in said intermediate layer z>0.2, y>0 and x<0.1.

12. The cutting tool of claim 8 wherein said coating has a pronounced columnar grain structure with a grain width of <0.5 μm.

13. The cutting tool of claim 1 wherein one such α-Al$_2$O$_3$ layer is a top visible layer at least along a cutting edge line.

14. The cutting tool of claim 1 wherein the coating on a rake face and along an edge line has been smoothed by brushing or by blasting to a surface roughness, R$_a$, of less than 0.2 μm over a measured length of 5 μm.

15. The cutting tool of claim 1 wherein said tool is a cutting insert, a solid carbide drill or a carbide end-mill.

16. A cutting tool comprising:
    a body including a plurality of functioning parts on a surface of the body;
    a hard and wear resistant coating on at least the functioning parts,
    wherein the body comprises cubic boron nitride or diamond,
    wherein the coating comprises at least one layer consisting essentially of crystalline α-Al$_2$O$_3$ with a thickness of from about 0.5 to about 10 μm, the crystalline α-Al$_2$O$_3$ having columnar grains with an average grain width of from about 0.1 to about 1.1 μm and being deposited by chemical vapor deposition at a temperature of from about 625 to about 800° C., and
    wherein said coating comprises at least one layer consisting of Ti(C,N) with a thickness of from about 0.5 to about 10 μm deposited between the body and said α-Al$_2$O$_3$-layer.

17. The cutting tool of claim 16, wherein said coating further comprises an intermediate layer of from about 0.5 to about 1.5 μm of TiC$_x$N$_y$O$_z$ between the α-Al$_2$O$_3$-layer and the Ti(C,N)-layer, where x+y+z>1 and z>0.

* * * * *